US007663466B1

(12) United States Patent
Jetton

(10) Patent No.: US 7,663,466 B1
(45) Date of Patent: Feb. 16, 2010

(54) CORNER-MOUNTED BATTERY FUSE

(75) Inventor: James Thomas Jetton, Ann Arbor, MI (US)

(73) Assignee: Yazaki North America, Inc., Canton, MI (US)

( * ) Notice: Subject to any disclaimer, the term of this patent is extended or adjusted under 35 U.S.C. 154(b) by 187 days.

(21) Appl. No.: 11/902,374

(22) Filed: Sep. 21, 2007

(51) Int. Cl.
*H01H 85/46* (2006.01)
*H01H 85/20* (2006.01)
*H01H 85/165* (2006.01)
*H01R 13/46* (2006.01)
*H05K 7/00* (2006.01)

(52) U.S. Cl. ....................... 337/191; 337/186; 337/187; 337/227; 337/283; 337/295; 361/833; 361/837; 439/620.26; 439/620.27; 439/893

(58) Field of Classification Search ................. 337/191, 337/295, 283, 227, 186, 187; 361/883, 837; 439/620.26, 620.27, 893
See application file for complete search history.

(56) References Cited

U.S. PATENT DOCUMENTS

| | | | | |
|---|---|---|---|---|
| 5,535,842 | A * | 7/1996 | Richter et al. | 180/279 |
| 5,643,693 | A * | 7/1997 | Hill et al. | 429/121 |
| 5,645,448 | A | 7/1997 | Hill | |
| 5,805,047 | A * | 9/1998 | De Villeroche et al. | 337/290 |
| 5,877,609 | A * | 3/1999 | Carter | 320/103 |
| 5,882,213 | A * | 3/1999 | Witek et al. | 439/76.2 |
| 5,886,611 | A * | 3/1999 | Schaller et al. | 337/189 |
| 6,222,439 | B1 * | 4/2001 | Tanigawa et al. | 337/401 |
| 6,294,978 | B1 * | 9/2001 | Endo et al. | 337/166 |
| 6,398,595 | B2 * | 6/2002 | Wakata et al. | 439/755 |
| 6,509,824 | B2 * | 1/2003 | Inaba et al. | 337/295 |
| 6,512,443 | B1 | 1/2003 | Matsumura et al. | |
| 6,551,147 | B2 * | 4/2003 | Wakata et al. | 439/754 |
| 6,576,838 | B2 * | 6/2003 | Matsumura | 174/66 |
| 6,580,032 | B2 * | 6/2003 | Sumida et al. | 174/59 |
| 6,723,920 | B2 * | 4/2004 | Higuchi et al. | 174/50 |
| 6,787,698 | B2 * | 9/2004 | Higuchi et al. | 174/50 |
| 6,806,421 | B2 * | 10/2004 | Matsumura | 174/50 |
| 6,830,482 | B2 * | 12/2004 | Matsumura et al. | 439/620.27 |
| 6,902,434 | B2 * | 6/2005 | Stack | 439/620.28 |
| 6,932,650 | B1 * | 8/2005 | Freitag | 439/620.26 |
| 6,934,164 | B2 * | 8/2005 | Higuchi et al. | 361/833 |
| 6,939,167 | B2 * | 9/2005 | Kosuge | 439/522 |
| 6,948,982 | B2 * | 9/2005 | Higuchi et al. | 439/620.26 |
| 7,046,115 | B2 * | 5/2006 | Higuchi et al. | 337/193 |
| 7,172,462 | B1 | 2/2007 | Gronowicz, Jr. | |
| 7,176,780 | B2 | 2/2007 | Iwata | |

(Continued)

*Primary Examiner*—Jayprakash N Gandhi
*Assistant Examiner*—Bradley H Thomas
(74) *Attorney, Agent, or Firm*—Daniel R. Edelbrock

(57) ABSTRACT

A fuse device for fitting over and around a corner of a battery housing has a top wall and two side walls extending downward from the top wall. The side walls are joined at a corner. A battery terminal for mechanical and electrical attachment to a battery post is provided in the top wall. Electrical connectors for connection to terminals on the ends of electrical cables are mounted on the side walls of the fuse device. The electrical connectors are linked through the walls to the battery terminal by fuses. Ribs extending down the side walls from the top wall pass close by each electrical connector to strengthen the structure of the fuse device and prevent rotation of the terminals on the ends of the cables as they are secured to the fuse device. Recessed strengthening ribs in the top wall extend radially outward from the battery terminal.

17 Claims, 7 Drawing Sheets

U.S. PATENT DOCUMENTS 7,233,474 B2 * 6/2007 Brown et al. ................ 361/104
7,292,130 B2 * 11/2007 Taga et al. .................. 337/159
7,347,733 B2 * 3/2008 Murakami ............. 439/620.27
7,361,841 B1 * 4/2008 Smolen et al. ........... 174/138 F
7,381,101 B2 * 6/2008 Roset et al. ................. 439/754
7,420,453 B2 * 9/2008 Matsumura et al. ......... 337/295
7,578,710 B2 * 8/2009 Koelle et al. ................ 439/762
7,592,892 B2 * 9/2009 Ito et al. ..................... 337/159
7,597,595 B2 * 10/2009 Ohashi et al. ............... 439/766
2004/0124963 A1 * 7/2004 Nakamura .................. 337/256
2004/0130430 A1 * 7/2004 Matsumura et al. ......... 337/181
2005/0116806 A1 * 6/2005 Iwata ......................... 337/188
2005/0285709 A1 * 12/2005 Matsumura et al. ......... 337/227
2006/0003627 A1 * 1/2006 Freitag ....................... 439/504
2007/0091547 A1 * 4/2007 Murakami .................. 361/627
2007/0267917 A1 * 11/2007 Puschkat ................... 307/10.1
2008/0030295 A1 * 2/2008 Matsumoto et al. ......... 337/290
2008/0050981 A1 * 2/2008 Pavlovic et al. ............. 439/701
2009/0067122 A1 * 3/2009 Darr ........................... 361/626

* cited by examiner

CORNER-MOUNTED BATTERY FUSE

BACKGROUND OF THE INVENTION

1. Field of the Invention

This invention relates in general to fuses for vehicle battery connections and more specifically to a fuse device that mounts over and around a corner of a battery housing so the fuse device is stable during electrical cable attachment and vehicle operation.

2. Discussion of Related Art

Various mounting structures for use in distributing electrical current from an automotive battery through integral fuses to several circuits are known in the art. In U.S. Pat. No. 7,176,780, for example, a fuse unit hangs relatively free of the battery and relies mainly if not solely on the support of the battery post to which it attaches. In U.S. Pat. No. 5,645,448, the main fuse is located in a module mounted on a top surface of a battery. Only the terminals on the electrical cables can contact the battery side walls when a twisting force is applied to the module.

High twisting forces caused by torque generated when terminated electrical cables are attached to the fuse units or modules can damage the connection between the battery terminal and post. The fuse or fuses within the units or modules may also be broken or the electrical connections with the fuses may become unreliable. For such types of components supported mainly by the battery post, a fuse device capable of withstanding the torque required to attach large gauge wires without damage to the fuse device or electrical connections with the fuses and battery would seem to be beneficial to the art.

SUMMARY OF THE INVENTION

Accordingly, it is an object of this invention to provide a fuse device that uses the support of a battery housing to allow electrical cables with high torque requirements to be attached to the fuse device without damage to the fuse device or the electrical connection with the battery.

Another object of the invention is to strengthen the structure of the fuse device, without adding significant weight, by use of strategically placed ribs.

A further object of the invention is to make it easier to attach terminated cables to the fuse device by including an anti-rotation feature.

In carrying out this invention in the illustrative embodiment thereof, a fuse device has a top wall joined to two adjacent side walls. The top wall includes a battery terminal for securing the fuse device on a positive battery post of a battery in a housing or casing. The side walls each include protruding electrical connectors for mating with terminated electrical cables. Fuses or fusible portions in the walls of the fuse device electrically link the electrical connectors on each side wall with the battery terminal in the top wall. When secured to the battery post, the fuse device has flat surfaces in direct contact with top, side and front surfaces of the battery case or housing. In other words, the fuse device fits over and around a corner of the battery housing to allow much of the torque from cable attachment to the electrical connectors to be held by the battery housing and not the battery terminal itself. This design allows for large gauge wires with high torque requirements to be attached to a battery fuse. Narrow ribs in the top wall and extending along the side walls of the fuse device further strengthen the device. The ribs are placed around the electrical connectors such that terminals on the ends of the electrical cables fit between the ribs and are prevented from rotating during fastening of the terminals to the electrical connectors.

BRIEF DESCRIPTION OF THE DRAWINGS

This invention, together with other objects, features, aspects and advantages thereof, will be more clearly understood from the following description, considered in conjunction with the accompanying drawings.

DETAILED DESCRIPTION OF THE ILLUSTRATED EMBODIMENT

Figure 1:
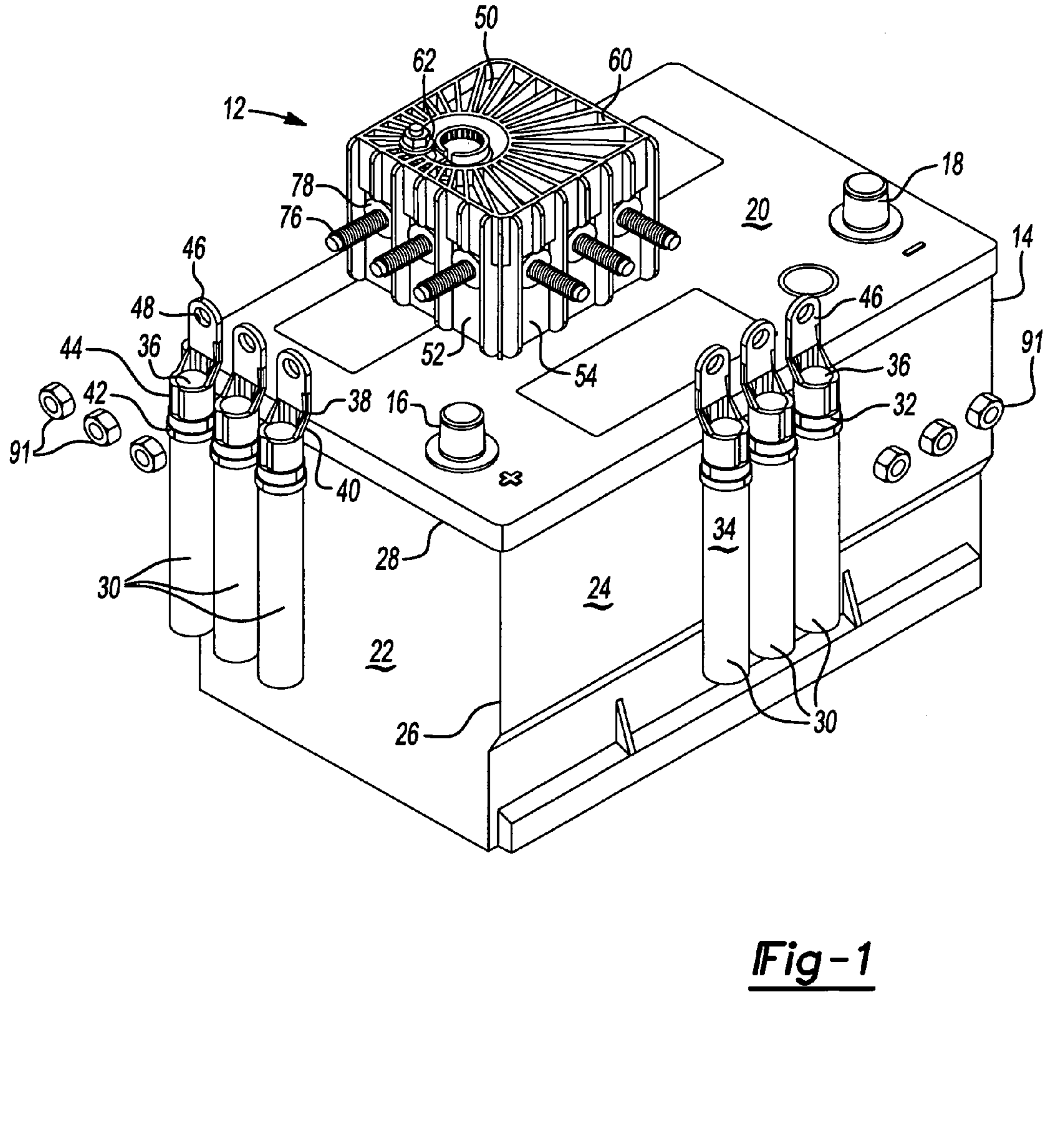
FIG. 1 is an exploded perspective view of a fuse device according to the present invention in combination with a battery housing and electrical terminals on the ends of high current cables.

Referring now to FIG. 1, a fuse component or device 12 is illustrated in combination with a vehicle battery encased in a housing 14. The battery has a positive current battery post 16 and a negative current battery post 18. The housing 14 is generally rectangular with a first, planar top surface 20 from which the posts extend. A second planar surface 22 and a third planar surface 24 form adjoining side or side and front surfaces meeting at a corner 26. The second and third surfaces 22 and 24 are depicted as being at right angles to each other. The top surface 20 has a ledge 28 that slightly overhangs the side surfaces or side and front surfaces. The battery housing 14 is for illustrative purposes only and may have a different structure or design more closely associated with other power or voltage sources known in the art.

Electrical wires or cables 30 are broadly represented as being directed upward along the planar surfaces 22, 24 of the battery housing 14. The cables 30 are generally large gauge and routed from various vehicle electrical equipment requiring high current, such as an alternator, starter motor, entertainment and information systems, etc. The cables 30 have ends 32 from which a segment of outer insulation jacket 34 has been stripped or removed to expose a conductor 36. Eyelet terminals 38 have cable-connect ends 40 each with two sets of crimp tabs for mechanical and electrical connection to the cables 30. A first set of crimp tabs 42 secures the terminal 38 to the cable insulation jacket 34 near the cable end 32. A second set of crimp tabs 44 make electrical connection with the cable conductor 36 at the stripped ends 32. Flat contact sections 46 of the terminals 38 each have apertures 48. Though a particular type of conventional eyelet terminal 38 is shown, other types of terminals may be used to terminate the electrical cables 30 for connection to the fuse device 12.

As best illustrated in FIGS. 1 and 3-6, the fuse device 12 according to the present invention has a substantially flat top wall 50, a first side wall 52, and a second side wall 54 joined to the first side wall 52 at a corner 56. The side wall 52 extends perpendicularly downward, as oriented in the drawings, from a first edge 57 (FIG. 3) of the top wall 50. The side wall 54 extends perpendicularly downward from a second, contiguous edge 58 of the top wall. The side walls each have a length and width. The length extends between the edges of the top wall and opposite, lower edges 59 of the side walls. The side walls are illustrated as being at right angles to each other, so the fuse device 12 has the general shape of a box open at the bottom and two sides. The fuse device could be square or rectangular depending on the widths of the side walls. The fuse device is, for example, injection molded from an electrically non-conductive thermoplastic, such as glass-filled polypropylene, which is impervious to battery acid.

The top wall 50 has an outer raised rim 60. A battery terminal 62, made of an electrically conductive metal, is insert-molded or otherwise mounted in the top wall. The battery terminal 62 is positioned and configured to fit and tighten around the positive current battery post 16 when the fuse device 12 is supported on the battery housing 14. The illustrated battery terminal 62 is a conventional, wedge-type battery terminal and is only meant to illustrate one type of battery attachment means for mechanically and electrically connecting the fuse device 12 to the battery housing 14 at the post 16. The tightening of an accessible nut 64 on battery terminal bolt 65 causes circular bracket 66 to clamp around the post 16. Again, other types and structures could be used in the fuse device 12 as a battery attachment means.

The battery terminal 62 is closely surrounded about its main perimeter by a circular inner rim 70 formed on the top wall 50. Narrow fins or ribs 72 extend radially outward from the inner rim 70 to the outer rim 60 to strengthen the structure of the top wall 50. The ribs 72 are recessed within the rims such that they provide a low profile and do not project high enough to interfere with access to the nut 64 of the battery terminal 62.

Narrow fins or ribs 74 also extend up and down the side walls 52, 54 of the fuse device 12, from the top wall edges to the lower side wall edges 59, to strengthen the structure of the side walls. The ribs 74 are placed or spaced apart predetermined distances. Electrical connectors in the form of threaded fasteners or studs 76 extend perpendicularly outward from the side walls. Three studs are illustrated on each side wall, but there could be more or less depending on the number of electrical cables 30 required to be attached to the battery through the fuse device 12. The studs 76 are joined to circular contact bases or plates 78. The studs and contact bases are plated steel, for example, insert molded into the thermoplastic of the fuse device side walls.

Upper portions 80 of the fuse device side walls 52, 54 are set outward from a remaining area of the side walls. This design maintains the thickness and therefore the strength of the side walls while allowing formation of a groove or channel 82, best shown in FIG. 6, on inner surfaces 84 and 86 of the side walls 52, 54 respectively, just under the top wall 50. This channel 82 enables the fuse device 12 to fit around the ledge 28 of the top surface 20 of the battery housing 14. The side walls 52, 54 of the fuse device can then press against the planar surfaces 22, 24 of the battery housing. If a battery housing doesn't have a ledge, the channel 82 would not be needed but also would not interfere with the contact between the side walls 22, 24 of the fuse device and the side surfaces or side and front surfaces of the battery housing 14. There are shorter length ribs 90 on the outside of the upper portions 80 of the side walls 52, 54 extending down to the contact plates 78 to provide further strength to the side walls. The ribs 90 extend directly between an edge of the top wall and the contact plates.

Figure 2:
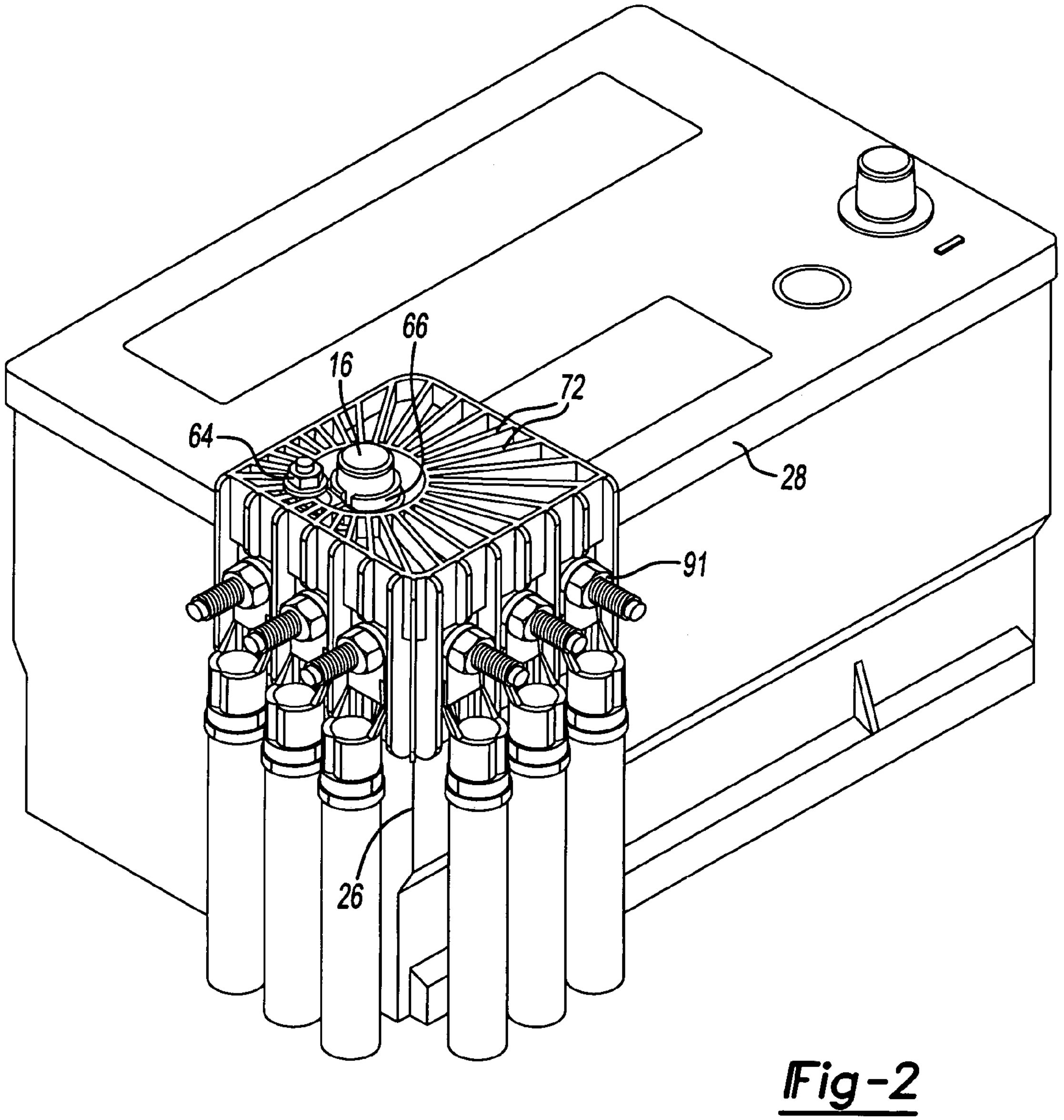
FIG. 2 is an assembled view of the fuse device, battery housing, and electrical terminals.
Figure 3:
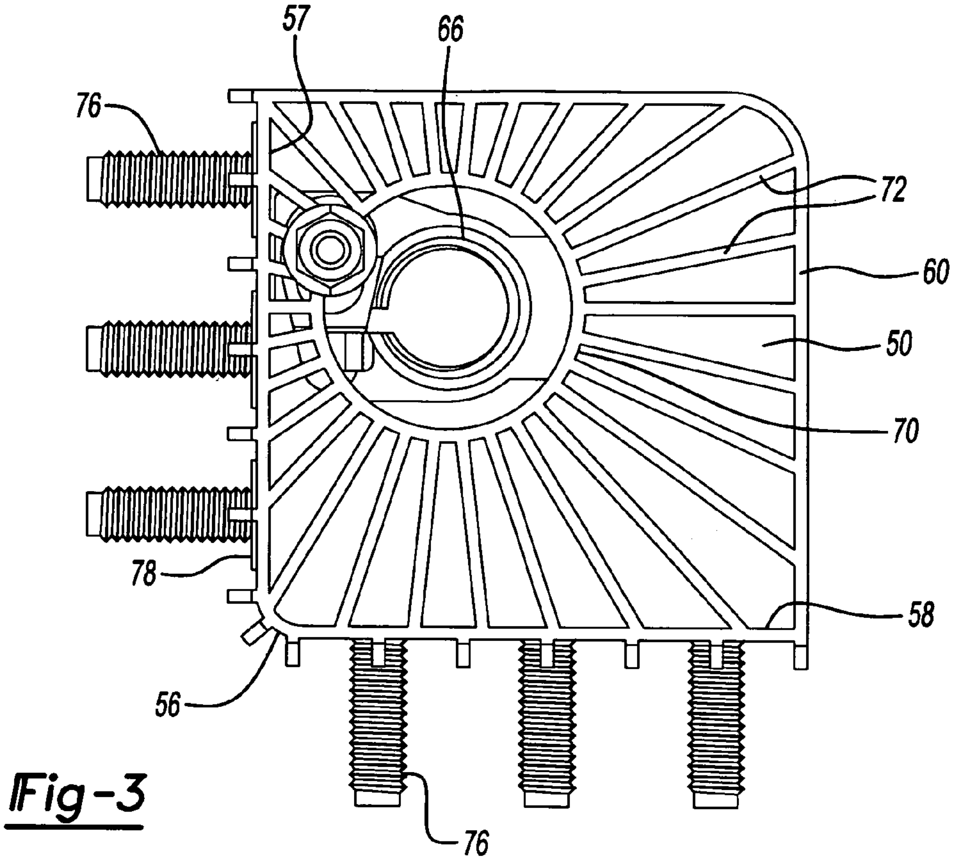
FIG. 3 is a top view of the fuse device.
Figure 4:
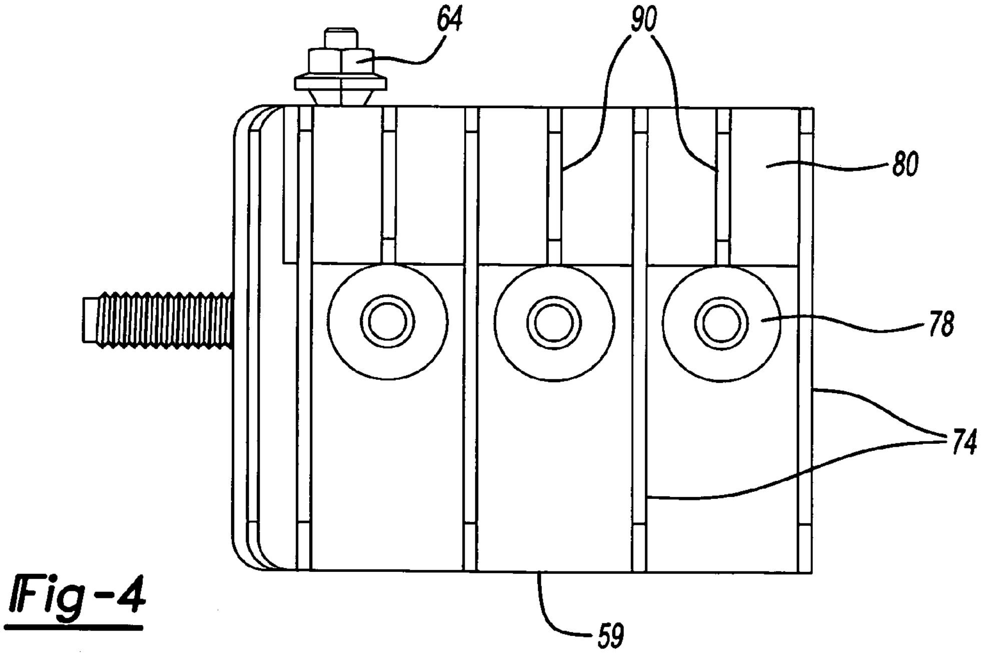
FIG. 4 is a side view of the fuse device.
Figure 5:
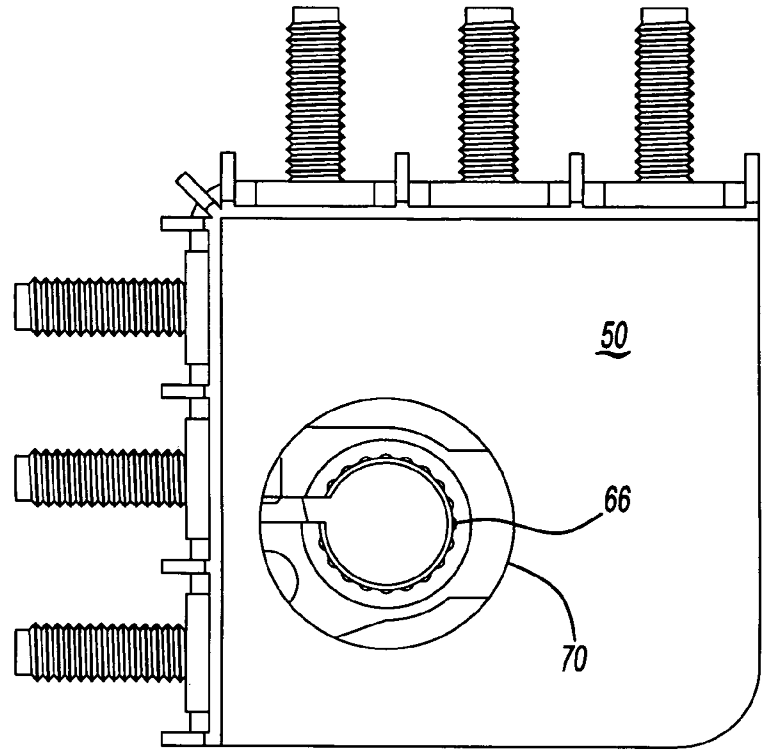
FIG. 5 is an underside view of the fuse device.
Figure 6:
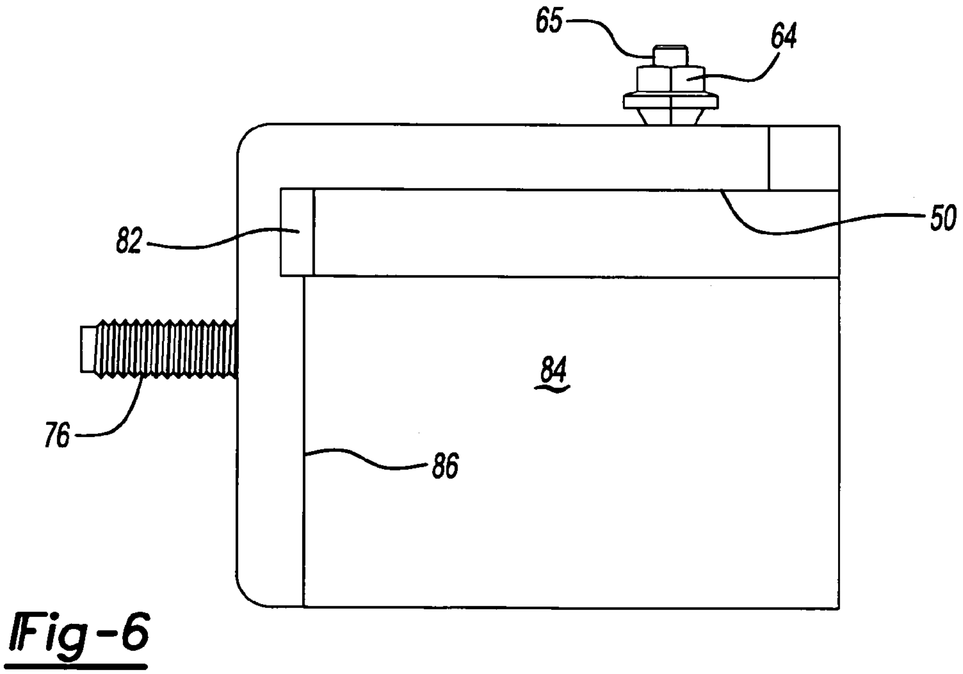
FIG. 6 is a side view of the interior of the fuse device.

The fuse device 12 securely mounts to the battery housing 14. The generally flat surfaces 50, 52 and 54 that rest or press against the top, side or side and front surfaces of the battery housing provide mechanical advantage to the attachment of the battery fuse device. The longer ribs 74 on the side walls of the fuse device serve a second function by being spaced closely around the contact plates 78. When the apertures 48 in the eyelet terminals 38 on the cable ends 32 receive the studs 76 and the flat contact sections 46 of the eyelet terminals are pressed against the contact plates 78, the eyelet terminals can't rotate as nuts 91 are used to secure the terminals on the fuse device, as depicted in FIG. 2. The fuse device withstands the attachment torque required to secure large gauge wires while the fuse device itself may only be attached to the battery post. The ribs 72 recessed between the top wall rims add strength and rigidity to the structure. Again, the ribs 74 on the side walls provide both a strengthening and anti-rotation feature, preventing the terminals on the cable ends from rotating as the nuts are tightened on the studs.

The fuse device of this invention remains stable during vehicle operation and does not put undue stress on the battery post. Variations on the design are possible. For example, the fuse device could have one side wall rather than two if the number of needed electrical connections is small. One side wall would at least transfer some amount of torque to the battery housing.

Figure 7:
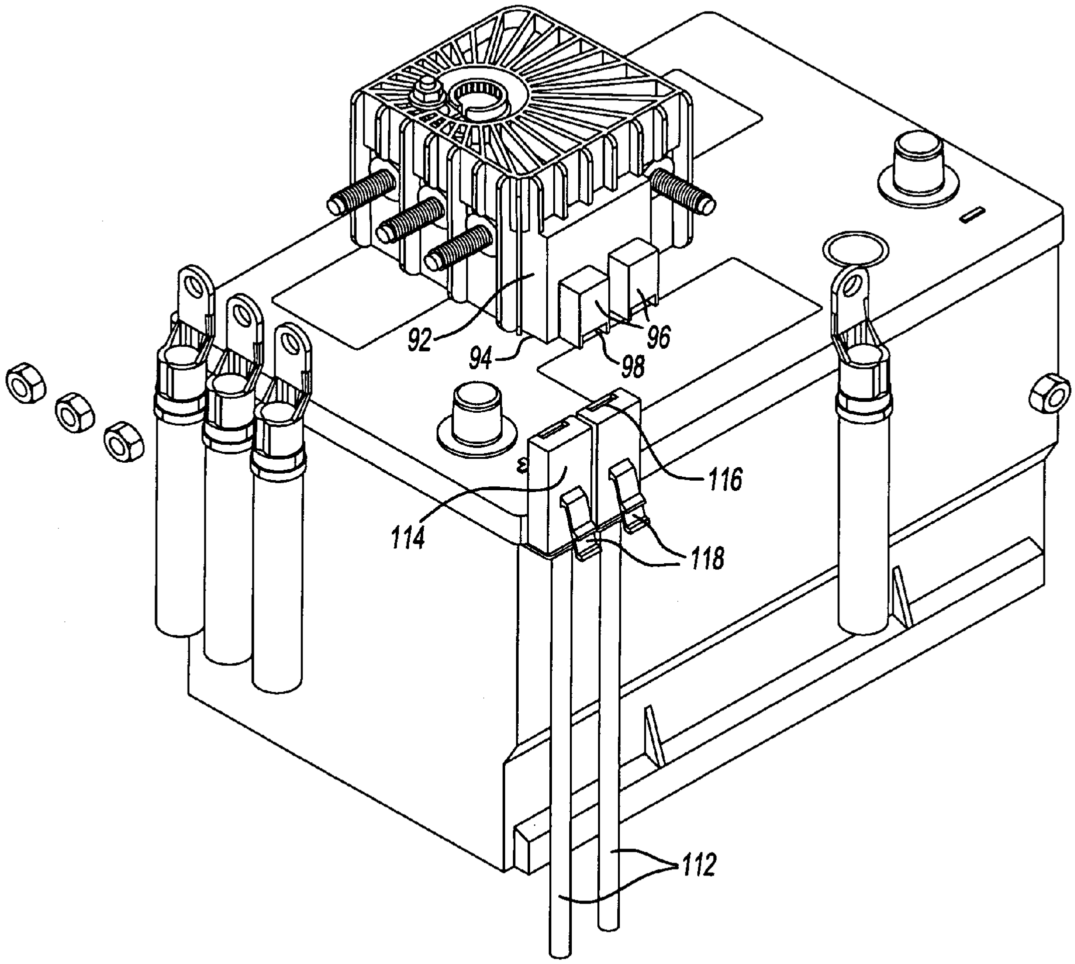
FIG. 7 is an exploded perspective view of a fuse device according to the present invention in combination with a battery housing and electrical terminals and connectors on the ends of high current and lower current cables.
Figure 8:
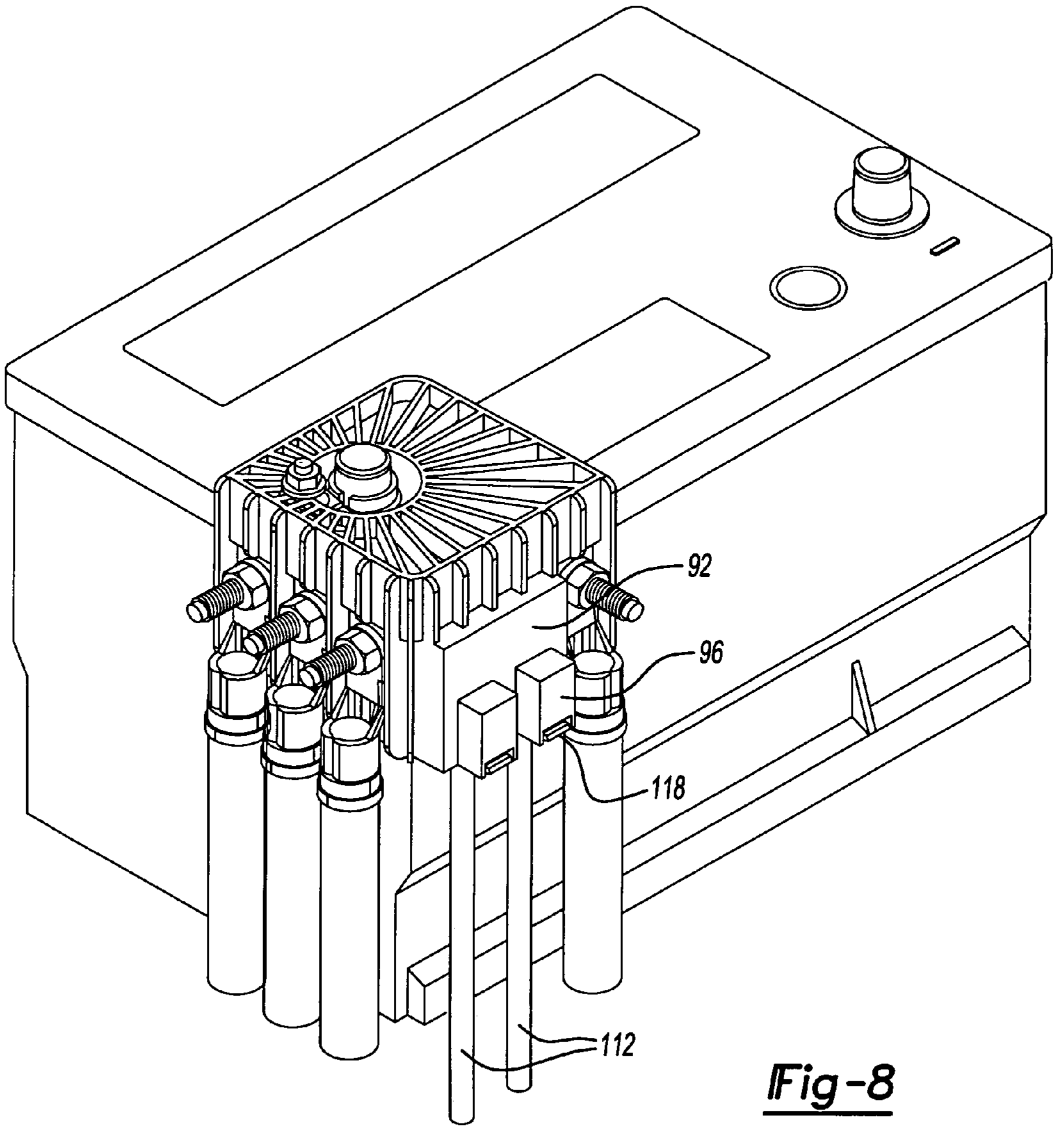
FIG. 8 is an assembled view of the fuse device of FIG. 7, battery housing and electrical terminals and connectors.

FIGS. 7 and 8 are meant to illustrate that other types of electrical connectors or electrical connection means could be used in combination with or in place of the studs 76. In the illustrated example, a section of the side wall 54 is extended outward from the fuse device beneath the shorter length ribs 90 to form a rectangular outcropping or block-like projection 92 with an inner, divided or partitioned cavity (not shown) and an opening 94 to the cavity on its underside. Box-like connector latch means or casings 96 are formed on the outside of the projection 92 and have lower insertion ends 98.

Figure 9:
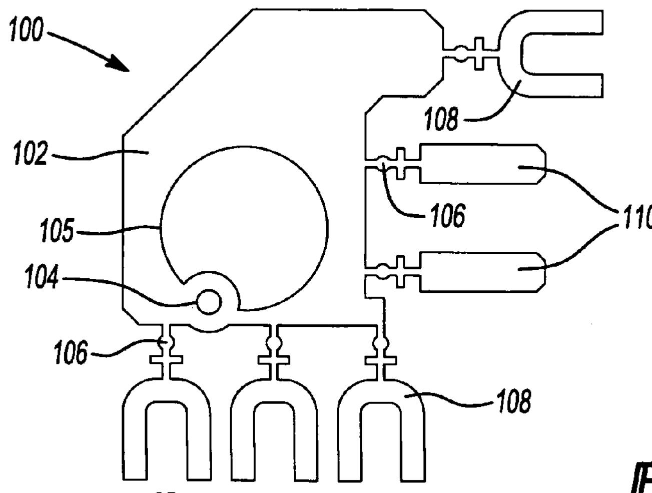
FIG. 9 is a top view of a lead frame with fusible elements as formed for use in the fuse device.
Figure 10:
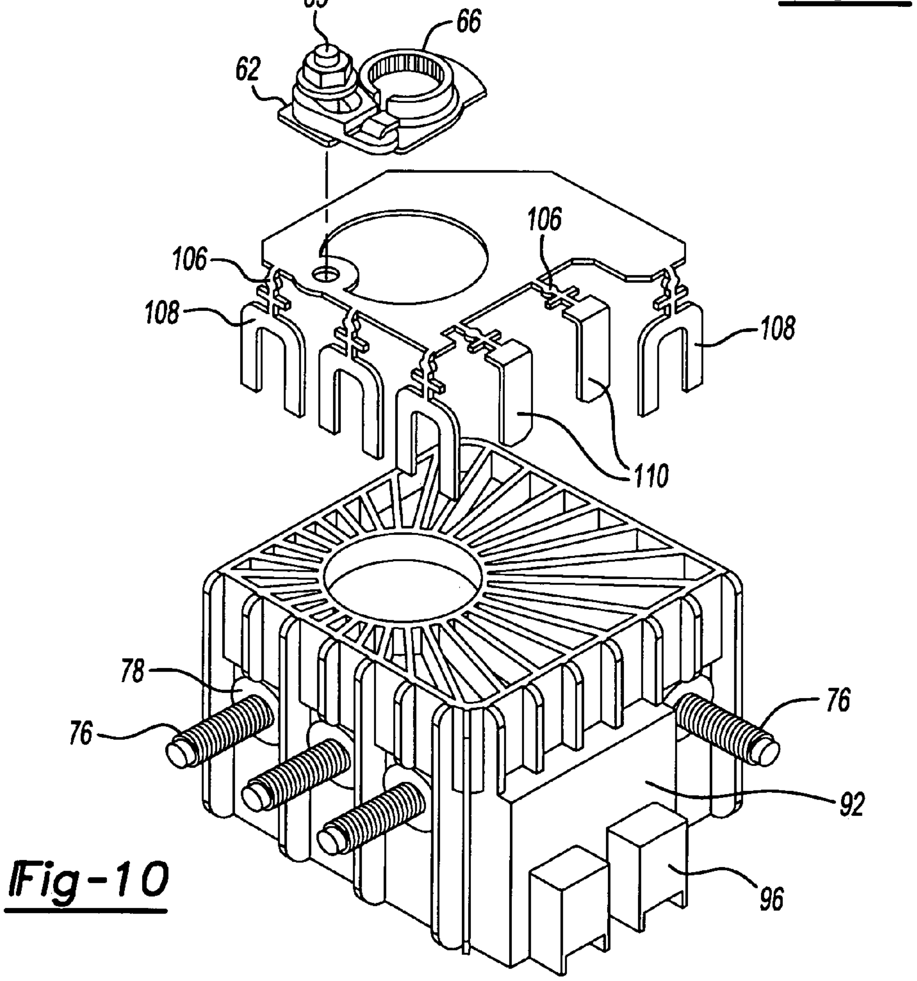
FIG. 10 is an exploded perspective view of a battery terminal and the lead frame as they would be oriented for insert-molding into the fuse device.

A bus bar structure or lead frame 100, shown in FIGS. 9 and 10, is stamped or otherwise formed from an electrically conductive material such as copper. The lead frame 100 has a substantially flat contact section 102 with an aperture 104 for receiving the battery terminal bolt 65 and making mechanical and electrical connection with the battery terminal 62. A larger aperture 105 accommodates the bracket part 66 of the terminal. Extending from the contact section 102 are integral fuses, fuse elements or fusible portions 106 leading to u-shaped contacts 108 for electrical connection with the studs 76 and contact bases 78. For the fuse device 12 having all studs 76 (FIG. 1), all of the lead frame contacts would be u-shaped. However, for the slightly modified fuse device illustrated in FIG. 7, some of the contacts would be flat terminal blades 110 for receipt in the rectangular projection 92, as depicted in FIGS. 9 and 10.

The fusible elements or portions 106 could be of the conventional type, and might include a tin bead or solder ball to provide tin to copper migration in the fusing area. Prior to insert molding the connected battery terminal 62 and lead frame 100 into the top wall 50 and side walls 52, 54 of the fuse device, or over-molding the fuse device walls around the lead frame, the fusible elements or portions 106 and u-shaped contacts 108 are bent downward at right angles, as illustrated in FIG. 10. The terminal blades 110 are bent downward from the fuse elements 106.

Referring back to FIGS. 7 and 8, electrical wires 112 are terminated by connectors 114. The electrical wires 112, for example, may be of a lower current than wires 30, routed from vehicle equipment such as lighting systems or electrical subsystems like interior electrical control. The connectors 114 have slots 116 for receiving the terminal blades 110 of the lead frame 100 and providing electrical connection between the wires 112 and the fuse device when the connectors 114 are inserted into the partitioned inner cavity of the projection 92 through the opening 94. Deflectable latch arms 118 are received through the insertion ends 98 and locked in the latch casings 96 as the terminal blades 110 become fully received in the connectors 114 within the projection 92 (FIG. 8). This structure maintains the advantages of the corner-mounted fuse device while giving the fuse device the flexibility to accommodate some other types of electrical connections.

Since minor changes and modifications varied to fit particular operating requirements and environments will be understood by those skilled in the art, this invention is not considered limited to the specific examples chosen for purposes of illustration. The invention is meant to include all changes and modifications which do not constitute a departure from the true spirit and scope of this invention as claimed in the following claims and as represented by reasonable equivalents to the claimed elements.

The invention claimed is:

1. A fuse device for mechanically and electrically attaching electrical cables to a voltage source, the fuse device comprising:

- a top wall for fitting against a first top surface of the voltage source;
- means mounted to the top wall for electrically connecting the fuse device to the voltage source;
- a first side wall arranged to press against a second side surface of the voltage source;
- a second side wall arranged to press against a third side surface of the voltage source;
- each of the side walls having means on the side wall extending outward from the side wall for making a mechanical and electrical connection with an electrical cable; and
- fuses routed within the top wall and each of the side walls of the device electrically linking the means for making a mechanical and electrical connection with an electrical cable to the means for electrically connecting the fuse device with the voltage source.

2. The fuse device of claim 1 wherein the means for making a mechanical and electrical connection with the electrical cable includes at least one threaded stud.

3. The fuse device of claim 1 wherein the means for making a mechanical and electrical connection with the electrical cable includes at least one terminal blade for mating with a connector attached to an end of the electrical cable.

4. The fuse device of claim 1 wherein the voltage source is a battery and the means for electrically connecting the fuse device to the battery is a battery terminal that mounts on a positive battery terminal post of the battery.

5. The fuse device of claim 1 wherein the first side wall is joined to a first edge of the top wall and the second side wall is joined to a second edge of the top wall extending at an angle from the first edge.

6. The fuse device of claim 5 wherein each side wall has a length between the top wall edge and an opposite edge, with ribs extending along the length past the means for making mechanical and electrical connection with the electrical cable.

7. The fuse device of claim 6 further comprising shorter ribs on the side walls directly between the top wall edge and the means for making mechanical and electrical connection with the electrical cable.

8. The fuse device of claim 5 wherein the top wall is surrounded by an outer rim.

9. The fuse device of claim 8 further comprising recessed ribs extending between the means for electrically connecting the fuse device to the voltage source and the outer rim.

10. The fuse device of claim 5 wherein each side wall has a length between the top wall edge and an opposite edge, and the first side wall and the second side wall are joined at a corner along their lengths.

11. A fuse device for mounting on a battery housing, the fuse device comprising:

- a top wall;
- an attachment means within the top wall for electrically and mechanically securing the fuse device to a battery post;
- two side walls extending at a right angle from the top wall, the two side walls being joined together at a single corner, the two side walls and the top wall being sized and configured such that when the top wall rests on a top surface of the battery housing with the attachment means secured to the battery post the two side walls fit against adjacent side surfaces of the battery housing;
- at least one fastener protruding outward from each side wall, the at least one fastener being linked by a fusible portion routed through the side walls and top wall to the attachment means, whereby torque from a first electrical cable attachment to the fasteners is distributed to the battery housing; and
- a projection on at least one of the side walls, and at least one terminal located within the projection and linked by a fusible portion routed through at least one of the two side walls and top wall to the battery post attachment means, the at least one terminal being positioned for mating with an electrical connector on the end of a second electrical cable inserted into the projection.

12. The fuse device of claim 11 wherein there are multiple fasteners protruding outward from each side wall.

13. The fuse device of claim 12 wherein the multiple fasteners include threaded studs.

14. The fuse device of claim 13 wherein each threaded stud passes through a base contact for the first electrical cable mounted on a surface of the side wall.

15. The fuse device of claim 11 further comprising latch means on the projection for securing the electrical connector within the projection.

16. The fuse device of claim 11 wherein the side walls include ribs extending past the fasteners.

17. The fuse device of claim 11 further comprising an inner channel on each side wall immediately below the top wall for receiving a ledge on the top surface of the battery housing.

* * * * *